United States Patent
Wang (10) Patent No.: US 9,906,706 B2
(45) Date of Patent: Feb. 27, 2018

(54) IMAGE SENSOR AND IMAGING DEVICE

(71) Applicant: VisEra Technologies Company Limited, Hsin-Chu (TW)

(72) Inventor: Wei-Ko Wang, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 84 days.

(21) Appl. No.: 14/757,475

(22) Filed: Dec. 23, 2015

(65) Prior Publication Data
US 2017/0187948 A1    Jun. 29, 2017

(51) Int. Cl.
| | |
|---|---|
| H04N 5/232 | (2006.01) |
| H04N 5/369 | (2011.01) |
| H01L 27/146 | (2006.01) |
| G02B 7/32 | (2006.01) |
| H04N 9/04 | (2006.01) |
| G02B 7/34 | (2006.01) |
| G02B 5/20 | (2006.01) |
| G02B 3/00 | (2006.01) |

(52) U.S. Cl.
CPC ........ *H04N 5/23212* (2013.01); *G02B 3/0006* (2013.01); *G02B 5/201* (2013.01); *G02B 5/208* (2013.01); *G02B 7/32* (2013.01); *G02B 7/34* (2013.01); *H01L 27/14621* (2013.01); *H01L 27/14625* (2013.01); *H01L 27/14627* (2013.01); *H04N 5/3696* (2013.01); *H04N 9/045* (2013.01)

(58) Field of Classification Search
CPC ................................................. H04N 5/23212
See application file for complete search history.

(56) References Cited

U.S. PATENT DOCUMENTS

| | | | | |
|---|---|---|---|---|
| 9,485,442 | B1* | 11/2016 | Li ........................ | H04N 5/3696 |
| 2015/0244957 | A1* | 8/2015 | Kim ..................... | H04N 5/3696 |
| | | | | 348/302 |
| 2015/0381907 | A1* | 12/2015 | Boettiger .............. | H04N 5/332 |
| | | | | 348/164 |
| 2017/0034499 | A1* | 2/2017 | Doron .................. | H04N 13/025 |

FOREIGN PATENT DOCUMENTS

| | | |
|---|---|---|
| JP | 2011103335 A | 5/2011 |
| JP | 2014514733 A | 6/2014 |
| JP | 2015162562 A | 9/2015 |

OTHER PUBLICATIONS

An Office Action from corresponding JP Application No. 2016-098831 dated Jul. 25, 2017; 6 pgs. with translation.

* cited by examiner

*Primary Examiner* — Christopher K Peterson
(74) *Attorney, Agent, or Firm* — Muncy, Geissler, Olds & Lowe, P.C.

(57) ABSTRACT

The present invention provides an image sensor, including: a sensor array layer including a plurality of normal sensor units and a pair of autofocus sensor units; a plurality of color filter units disposed on the sensor array layer to cover the plurality of normal sensor units; a pair of IR-pass filter units disposed on the sensor array layer to respectively cover the pair of autofocus sensor units; a micro-lens layer including a plurality of micro-lenses disposed on the color filter units and the IR-pass filter units, wherein one of the pair of autofocus sensor units detects infrared light came from a first side, and the other of the pair of autofocus sensor units detects infrared light came from a second side opposite to the first side to perform a phase detection autofocus function.

15 Claims, 10 Drawing Sheets

IMAGE SENSOR AND IMAGING DEVICE

BACKGROUND OF THE INVENTION

Field of the Invention

The present disclosure relates to an image sensor, and in particular to an imaging device capable of performing a phase detection autofocus function in a low-light environment.

Description of the Related Art

In recent years, phase detection autofocus (PDAF) technology has been introduced to imaging products, such as DSLR cameras and mobile phone cameras. Phase detection is achieved by dividing the incoming light into a pair of images and comparing them. Specifically, one conventional method is to have two green pixels with opaque materials covering half of the area of their apertures. The differential signal of the two pixels is calculated to find if the object is in a front focus or back focus position. This gives the direction and an estimate of the required amount of focus mechanism movement. However, the structure cannot perform the PDAF function under low-light conditions, because the collected signals for phase detection are too weak.

On the other hand, in the field of surveillance, an infrared pixel for near-infrared detection is arranged in the image sensor array to replace one green pixel in the Bayer pattern. When the environment is too dark, the surveillance camera uses an assistant infrared light source to irradiate near-infrared light to the front of the surveillance camera, and the infrared pixel detects the near-infrared light reflected by the object in front of the surveillance camera. In this way, imaging products can perform imaging in a low-light environment. However, the existing imaging product embedded with infrared pixels still has no way of performing the PDAF function. In this regard, the purpose of the disclosure is to provide an image sensor and an imaging device using the same capable of performing the PDAF function in a low-light environment.

BRIEF SUMMARY OF THE INVENTION

A detailed description is given in the following embodiments with reference to the accompanying drawings.

The present disclosure provides an image sensor, including: a sensor array layer including a plurality of normal sensor units and a pair of autofocus sensor units; a plurality of color filter units disposed on the sensor array layer to cover the plurality of normal sensor units; a pair of IR-pass filter units disposed on the sensor array layer to respectively cover the pair of autofocus sensor units; a micro-lens layer comprising a plurality of micro-lenses disposed on the color filter units and the IR-pass filter units, wherein one of the pair of autofocus sensor units detects infrared light came from a first side, and the other of the pair of autofocus sensor units detects infrared light came from a second side opposite to the first side to perform a phase detection autofocus function.

In an embodiment, each of the pair of IR-pass filter units is divided into two halves, wherein one half is filled with an opaque material and the other half is filled with an IR-pass material.

In an embodiment, in the one of the pair of IR-pass filter units, the opaque material is located at the second side, and the IR-pass material is located at the first side, and in the other of the pair of IR-pass filter units, the opaque material is located at the first side, and the IR-pass material is located at the second side.

In an embodiment, the one of the pair of autofocus sensor units is adjacent to the other of the pair of autofocus sensor units, and the plurality of micro-lenses include a plurality of first micro-lenses and a second micro-lens, any of the plurality of first micro-lenses disposed on one of the plurality of the color filter units, and the second micro-lens disposed on the IR-pass filter unit to cover the pair of autofocus sensor units.

In an embodiment, the two adjacent autofocus sensor units, the IR-pass filter unit, and the second micro-lens compose a first phase detection autofocus set; the two adjacent autofocus sensor units of the first phase detection autofocus set is arranged along the row direction; and the image sensor further comprises a second phase detection autofocus set having the same components as the first phase detection autofocus set, but two adjacent autofocus sensor units of the second phase detection autofocus set is arranged along the column direction.

In an embodiment, the IR-pass filter unit allows light with wavelengths longer than 800 nm or 900 nm to pass through.

The present disclosure also provides an imaging device, including the aforementioned image sensor; a lens group disposed above the image sensor; and a dual band pass filter disposed above the lens group or between the lens group and the image sensor, wherein the dual band pass filter allows visible light and infrared light within a predetermined main wavelength to pass through.

In an embodiment, the imaging device further includes: a Notch infrared filter pattern inserted between the plurality of color filter units and the plurality of micro-lenses or between the plurality of color filter units and the plurality of normal sensor units, wherein the Notch infrared filter pattern blocks the infrared light with the main wavelength from reaching the plurality of normal sensor units.

In an embodiment, the imaging device further includes: an assistant infrared light source irradiating the infrared light with the main wavelength.

In an embodiment, the predetermined main wavelength is 850 nm, and the passband of the infrared light is 840~860 nm. In another embodiment, the predetermined main wavelength is 940 nm, and the passband of the infrared light is 930~950 nm.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
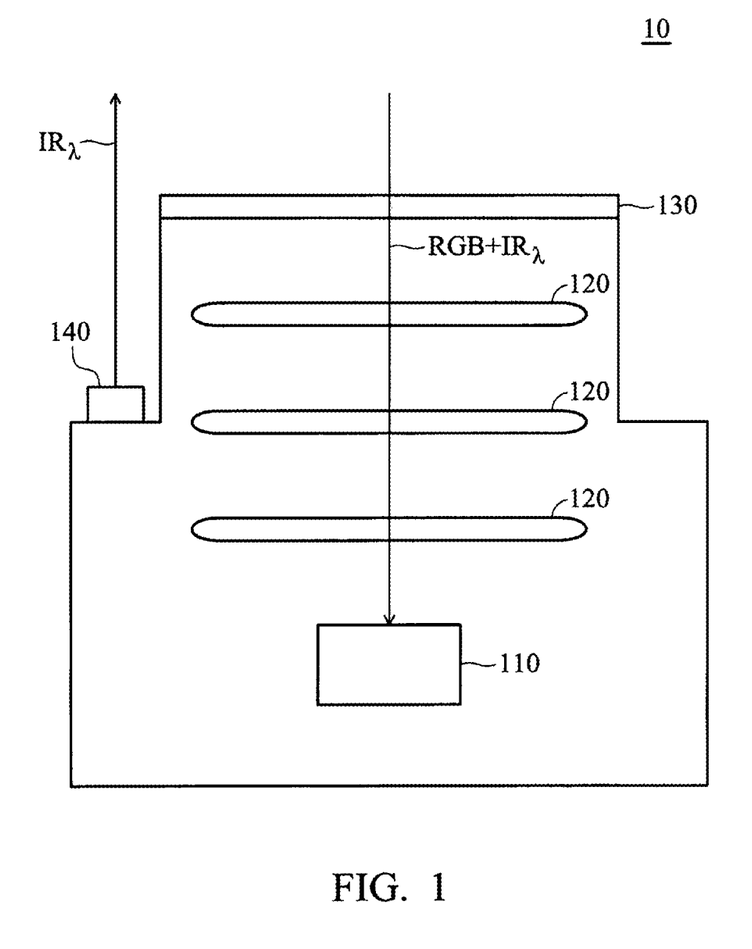
FIG. 1 is a schematic diagram showing an imaging device in accordance with an embodiment of the disclosure.
Figure 2:
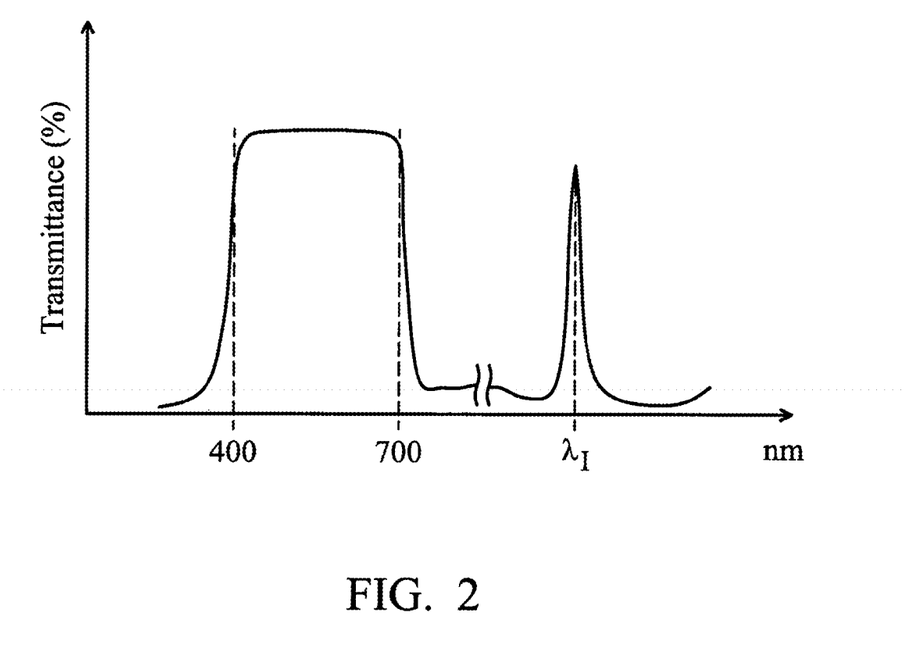
FIG. 2 is a diagram showing a spectral transmittance of a dual band pass filter of the disclosure.

FIG. 1 is a schematic diagram showing an imaging device in accordance with an embodiment of the disclosure. As shown in FIG. 1, an imaging device 10 includes an image sensor 110, a lens group 120, a dual band pass filter 130, and an assistant infrared light source 140. The image sensor 110 has a pixel array including red, green, and blue pixels and infrared pixels. The red, green, and blue pixels are used for receiving image light and converting it to the information that constitutes an image. The infrared pixels are used to detect signals for phase detection autofocus (PDAF). The specific structure of the image sensor 110 will be described latter. The lens group 120 is disposed above the image sensor 110 to make images of objects projected on the image sensor 110. The dual band pass filter 130 is disposed above the lens group 120 or between the lens group 120 and the image sensor 110 for passing light in the visible band and light with a predetermined infrared wavelength. The reference sign RGB+IR$_\lambda$ indicates a light beam passing through the dual band pass filter 130. FIG. 2 is a diagram showing a spectral transmittance of the dual band pass filter 130. As shown in FIG. 2, there are two passbands. One passband ranges from 400 nm to 700 nm, which allows most visible light to pass through. The other passband is mainly at a predetermined infrared wavelength $\lambda_1$ with a ±10 nm tolerance. In the disclosure, the predetermined infrared wavelength $\lambda_1$ is designed to 850 nm or 940 nm. That is to say, the infrared passband of the dual band pass filter 130 is designed to 840~860 nm or 930~950 nm. The assistant infrared light source 140 is disposed outside of the body of the imaging device 10 to irradiate near-infrared light having a main wavelength $\lambda_1$. The reference sign IR$_\lambda$ indicates a light beam irradiated from the assistant infrared light source 140.

With this configuration shown in FIG. 1, the imaging device 10 can use the assistant infrared light source 140 to irradiate near-infrared light to the front of the imaging device 10, and the image sensor 110 will detect the near-infrared light if the near-infrared light is reflected by an object in front of the imaging device 10. The near-infrared light detected by the infrared pixels of the image sensor 110 is utilized for PDAF calculation. In this way, the imaging device of the disclosure can perform the PDAF function even in a low-light environment.

Figure 3A:
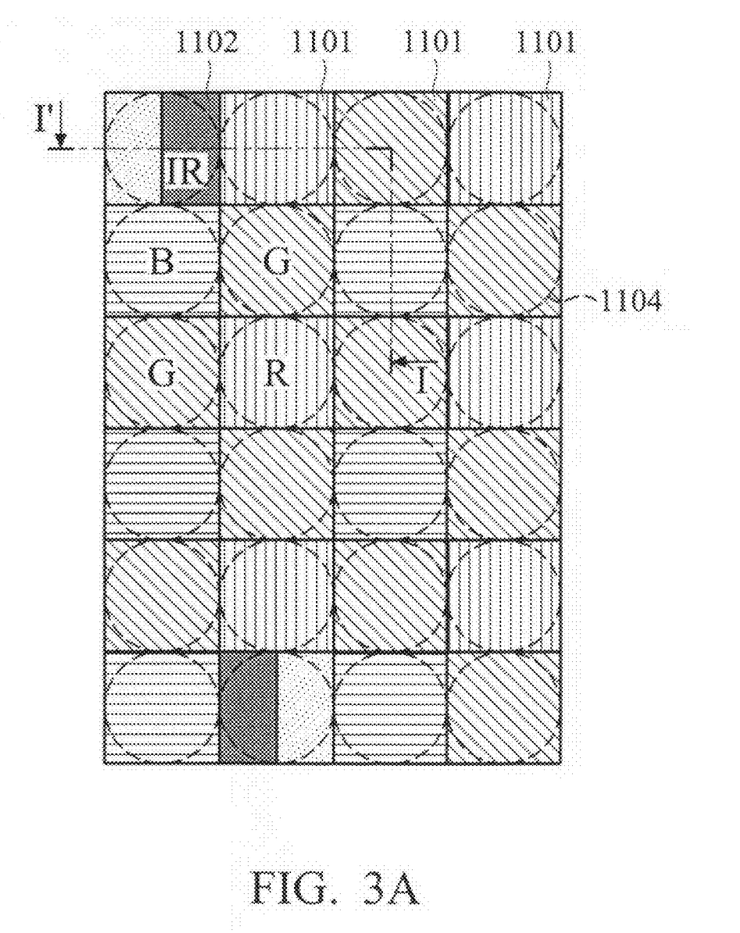
FIG. 3A is a top view of a portion of the image sensor in accordance with an embodiment of the disclosure.
Figure 3B:
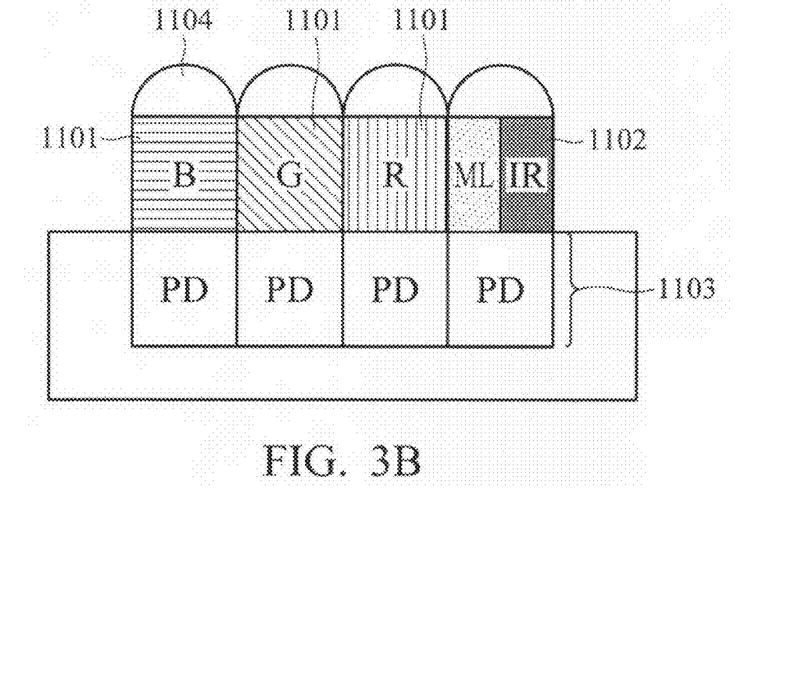
FIG. 3B is a cross-sectional view taken along line I-I' of FIG. 3A.
Figure 3C:
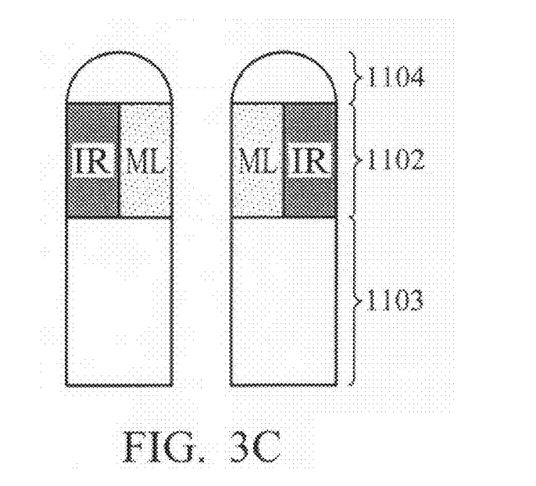
FIG. 3C is a sectional view shows a pair of infrared pixels shown in FIG. 3A.

In the following paragraphs, the specific structure of the image sensor 110 shown in FIG. 1 is described. FIG. 3A is a top view of a portion of the image sensor in accordance with an embodiment of the disclosure. FIG. 3B is a cross-sectional view taken along line of FIG. 3A. FIG. 3C is a sectional view shows a pair of infrared pixels shown in FIG. 3A. As shown in FIG. 3A, the image sensor has a pixel array where color filter units 1101 and a pair of IR-pass filter units 1102 are disposed.

In FIG. 3B, the vertical structure of the image sensor can be seen. The color filter units 1101 and the pair of IR-pass filter units 1102 are disposed on a sensor array layer 1103 composed of a plurality of sensor units PD arranged in the form of a matrix. Note that there are no differences between sensor units PD, but for ease of understanding, the sensor unit covered by the color filter unit 1101 to detect red, green, and blue light is sometimes called a normal sensor unit, and the sensor unit covered by the IR-pass filter units 1102 to detect assistant infrared light is sometimes called an infrared sensor unit or an autofocus sensor unit. Any of the color filter units 1101 and the IR-pass filter units 1102 covers one sensor unit PD. In addition, there are a plurality of micro-lenses 1104 respectively disposed on each of the color filter units 1101 and the IR-pass filter units.

The color filter units 1101 are red (R), green (G), and blue (B) filters. The IR-pass filter unit 1102 is divided into two halves. One half is filled with an opaque material ML such as metal. The other half is filled with infrared pass filter IR allowing light with near-infrared wavelengths to pass. For the pair of infrared pixels, as shown in FIG. 3C, the opaque materials ML in the two IR-pass filter units 1102 must be located at opposite sides. For example, if the opaque material ML of one infrared pixel is located at the left side (a side in the row direction) of the IR-pass filter unit 1102, then the opaque material ML of the other infrared pixel must be located at the right side (the opposite side in the row direction) of the IR-pass filter unit 1102. Also, if the opaque material ML of one infrared pixel is located at the upper side (a side in the column direction) of the IR-pass filter unit 1102, then the opaque material ML of the other infrared pixel must be located at the lower side (the opposite side in the column direction) of the IR-pass filter unit 1102. In this way, the two infrared pixels can respectively detect the infrared light came from two opposite sides to perform the PDAF function.

Figure 3D:
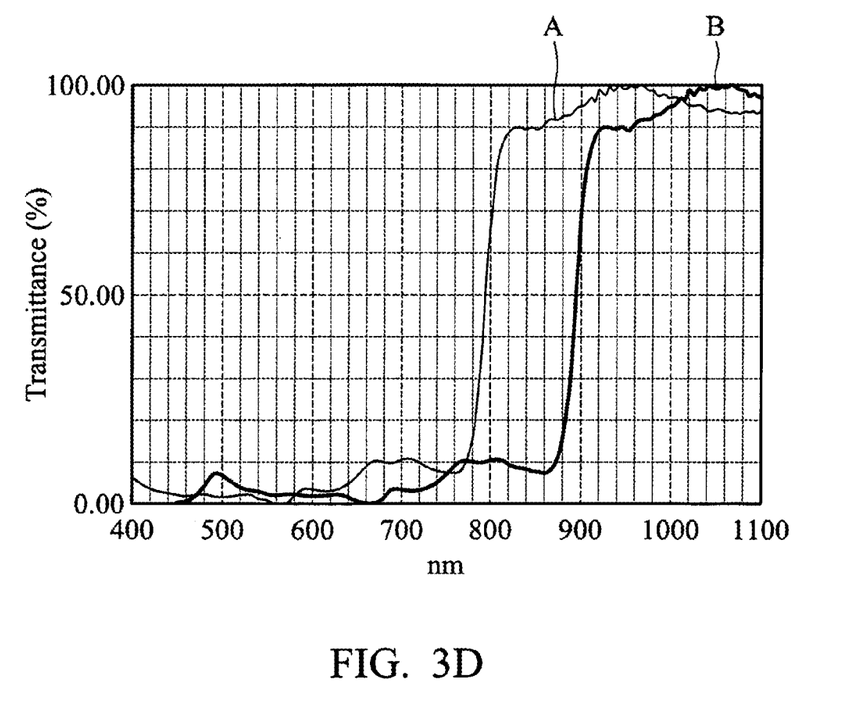
FIG. 3D is a diagram showing two spectral transmittance curves of an infrared pass filter in accordance with an embodiment.

FIG. 3D shows two appropriate spectral transmittance curves A and B of the infrared pass filter IR. The spectral transmittance curve A is approximately maintained at the minimum value (about 0~10%) at short wavelength bands and rapidly rises to the maximum value (about 90~100%) when the wavelength is longer than 800 nm. On the other hand, the spectral transmittance curve B is approximately maintained at the minimum value (about 0~10%) at short wavelength bands and rapidly rises to the maximum value (about 90~400%) when the wavelength is longer than 900 nm. The two spectral transmittance curves A and B are selected according to the infrared passband of the dual band pass filter 130 shown in FIG. 2. If the main wavelength $\lambda_1$ of the infrared passband of the dual band pass filter 130 is 850 nm, the infrared pass filter IR with the spectral transmittance curve A is selected. If the main wavelength $\lambda_1$ of the infrared passband of the dual band pass filter 130 is 940 nm, then the infrared pass filter IR with the spectral transmittance curve B is selected.

Figure 4A:
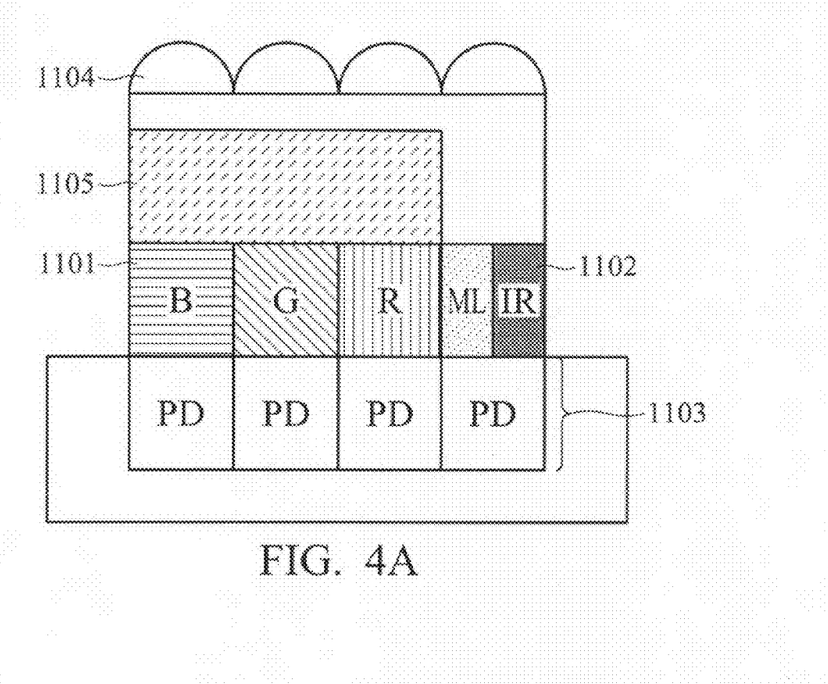
FIG. 4A is a cross-sectional view of the normal pixels and the infrared pixel in accordance with another embodiment of the disclosure.
Figure 4B:
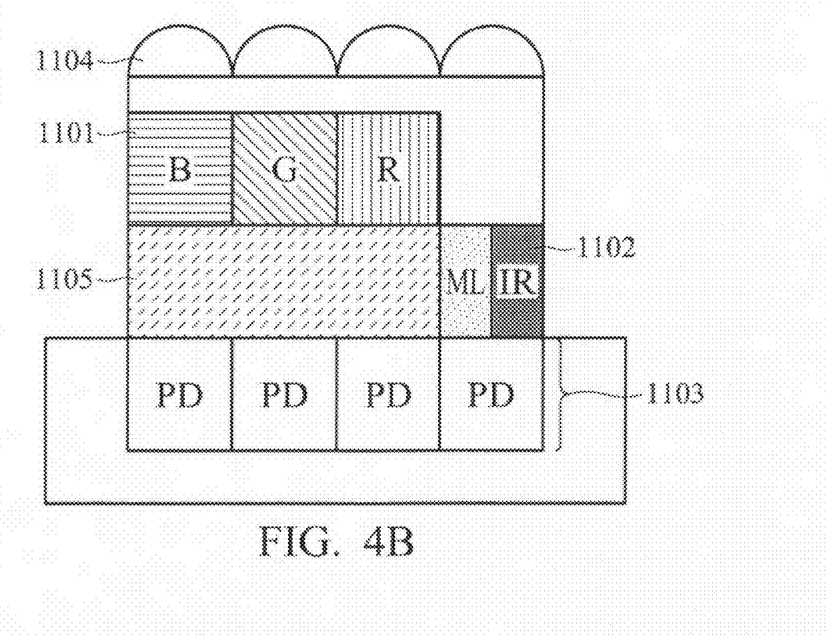
FIG. 4B is a cross-sectional view of the normal pixels and the infrared pixel in accordance with another embodiment of the disclosure.

FIGS. 4A and 4B show the cross-sectional views of the normal pixels and the infrared pixel in accordance with two embodiments of the disclosure. Since the dual band pass filter 130 (refer to FIGS. 1 and 2) has two passbands, the infrared light beam passing through the dual band pass filter 130 isn't only incident to the infrared pixels but also to the normal pixels. This may cause problems for the normal pixels to detect the intensity of red, green, and blue light. The intensity of incident light detected by the normal pixels will increase. With this concern, an embodiment of the disclosure provides a Notch infrared filter pattern to the image sensor. In an embodiment shown in FIG. 4A, a Notch infrared filter pattern 1105 is inserted between the micro-lenses 1104 and the color filter units 1101 so as to cover the normal sensor units PD (for detecting red, green, and blue light). In another embodiment shown in FIG. 4B, the Notch infrared filter pattern 1105 is inserted between the color filter units 1101 and the sensor array layer 1103 so as to cover the normal sensor units PD.

Figure 4C:
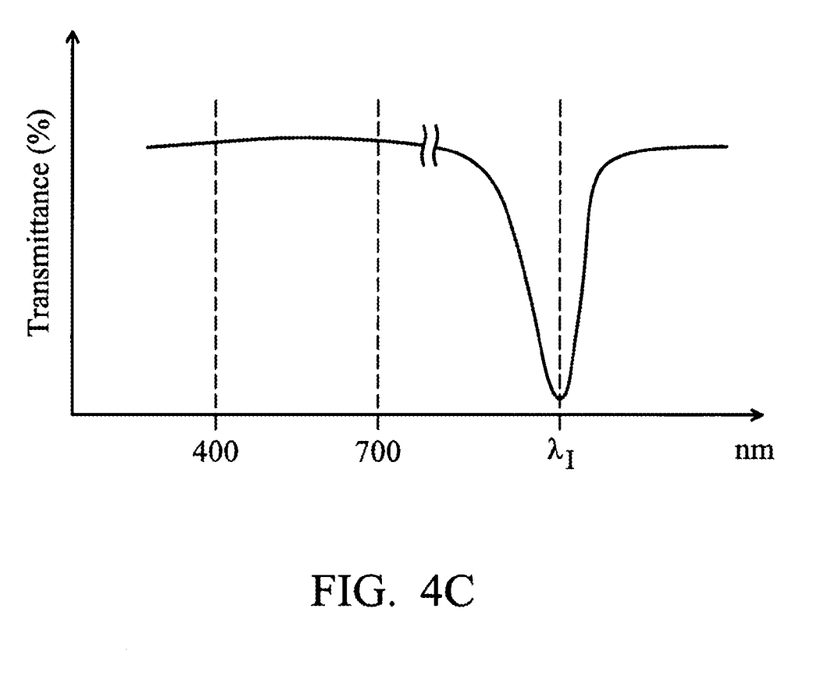
FIG. 4C is a diagram showing a spectral transmittance of a Notch infrared filter of the disclosure.

FIG. 4C is a diagram showing a spectral transmittance of a Notch infrared filter of the disclosure. As shown in FIG. 4C, the transmittance of the Notch infrared filter pattern 1105 is almost maintained at the maximum value for all wavelengths except for the predetermined infrared wavelength $\lambda_1$. The transmittance of the Notch infrared filter pattern 1105 has a minimum value at the predetermined infrared wavelength $\lambda_1$. Therefore, the infrared light with the main wavelength $\lambda_1$ will be blocked by the Notch infrared filter pattern 1105 and will not be incident to the normal sensor units PD. This predetermined infrared wavelength $\lambda_1$ is equal to the predetermined infrared wavelength $\lambda_1$ shown in FIG. 2. That is to say, if the main wavelength $\lambda_1$ of the infrared passband of the dual band pass filter 130 is 850 nm, the main wavelength $\lambda_1$ of the infrared light blocked by the Notch infrared filter pattern 1105 will also be 850 nm, and if the main wavelength $\lambda_1$ of the infrared passband of the dual band pass filter 130 is 940 nm, the main wavelength $\lambda_1$ of the infrared light blocked by the Notch infrared filter pattern 1105 will also be 940 nm.

With the configurations shown in FIG. 4A or 4B, the Notch infrared filter pattern 1105 helps the normal sensor units PD (for detecting red, green, and blue light) not to detect the assistant near-infrared light that passes the dual band filter 130. The normal sensor units PD can precisely detect the intensity of red, green, and blue light.

Figure 5A:
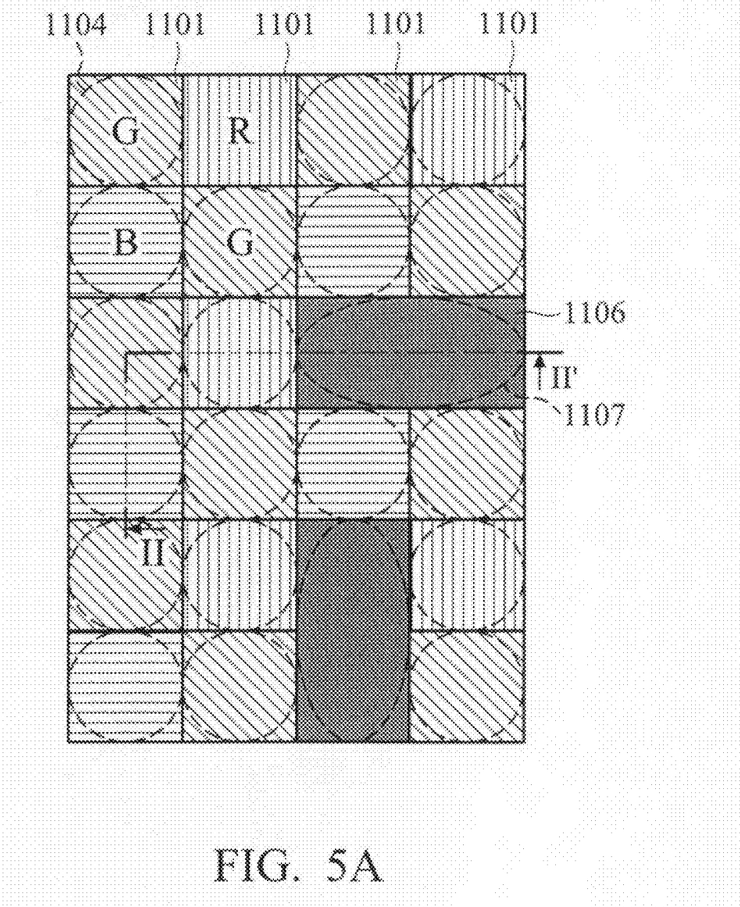
FIG. 5A is a top view of a portion of the image sensor in accordance with an embodiment of the disclosure.
Figure 5B:
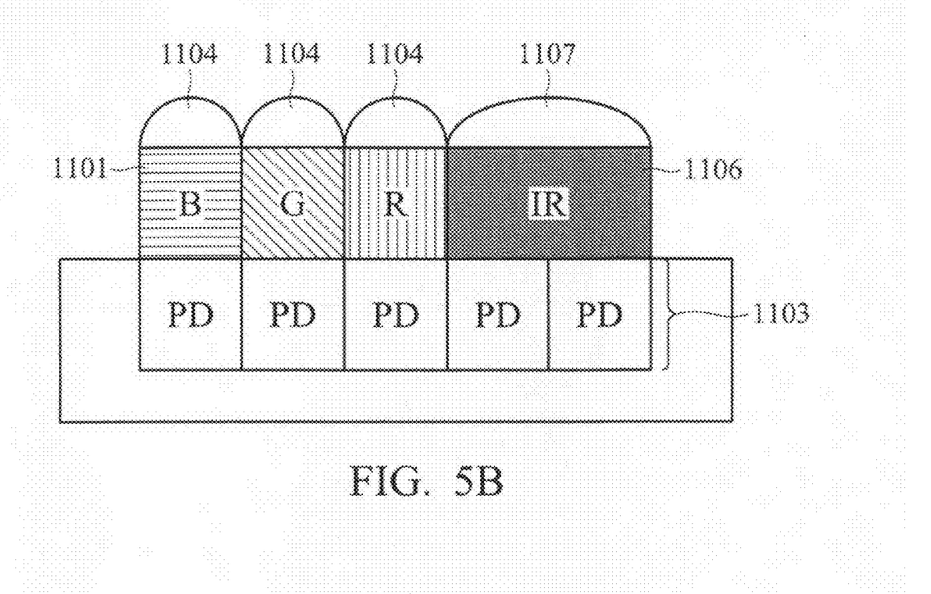
FIG. 5B is a cross-sectional view taken along line II-II' of FIG. 5A.

FIG. 5A is a top view of a portion of the image sensor in accordance with an embodiment of the disclosure. FIG. 5B is a cross-sectional view taken along line II-II' of FIG. 5A. As shown in FIG. 5A, the image sensor has a pixel array where color filter units 1101 and at least an IR-pass filter unit 1106 are disposed. In comparison with the configuration shown in FIG. 3A, the IR-pass filter unit 1106 occupies an area of two adjacent pixels.

In FIG. 5B, the vertical structure of the image sensor can be seen. The color filter units 1101 and the IR-pass filter unit 1106 are disposed on a sensor array layer 1103 composed of a plurality of sensor units PD arranged in the form of a matrix. Note that there are no differences between sensor units PD, but for ease of understanding, the sensor unit covered by the color filter unit 1101 to detect red, green, and blue light is sometimes called a normal sensor unit, and the sensor unit covered by the IR-pass filter units 1106 to detect assistant infrared light is sometimes called an infrared sensor unit or an autofocus sensor unit. Any of the color filter unit 1101 covers one sensor unit PD, but the IR-pass filter unit 1106 covers two adjacent sensor units PD. In addition, there are a plurality of micro-lenses 1104 respectively disposed on each of the color filter units 1101, and a specific micro-lens 1107 disposed on the IR-pass filter unit 1106.

In this embodiment, two adjacent infrared sensor units PD (for detecting assistant infrared light for the PDAF function) share one IR-pass filter unit 1106 and one specific micro-lens 1107. In this way, a half of the infrared light incident to the specific micro-lens 1107, which is came from the right side, is detected by the left sensor unit PD, and the other half of the infrared light incident to the specific micro-lens 1107, which is came from the left side, is detected by the right sensor unit PD. The two adjacent infrared pixels can also detect the infrared light came from two opposite sides to perform the PDAF function as well. Note that, as shown in FIG. 5A, the IR-pass filter unit 1106 and the specific micro-lens cannot only be disposed on two adjacent sensor units PD arranged in the row direction, but also be disposed on two adjacent sensor units PD arranged in the column direction. In this way, a half of the infrared light incident to the specific micro-lens 1107, which is came from the upper side, is detected by the lower sensor unit PD, and the other half of the infrared light incident to the specific micro-lens 1107, which is came from the lower side, is detected by the upper sensor unit PD.

Furthermore, the IR-pass filter unit 1106 has the same spectral transmittance shown in FIG. 3D. The two spectral transmittance curves A and B are selected according to the infrared passband of the dual band pass filter 130 shown in FIG. 2. If the main wavelength $\lambda_1$ of the infrared passband of the dual band pass filter 130 is 850 nm, the infrared pass filter IR with the spectral transmittance curve A is selected. If the main wavelength $\lambda_1$ of the infrared passband of the dual band pass filter 130 is 940 nm, then the infrared pass filter IR with the spectral transmittance curve B is selected.

Figure 6A:
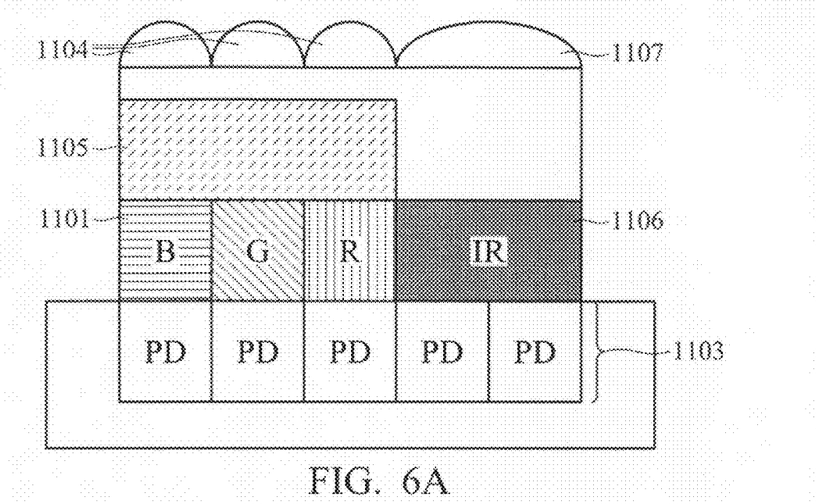
FIG. 6A is a cross-sectional view of the normal pixels and the infrared pixel in accordance with another embodiment of the disclosure.
Figure 6B:
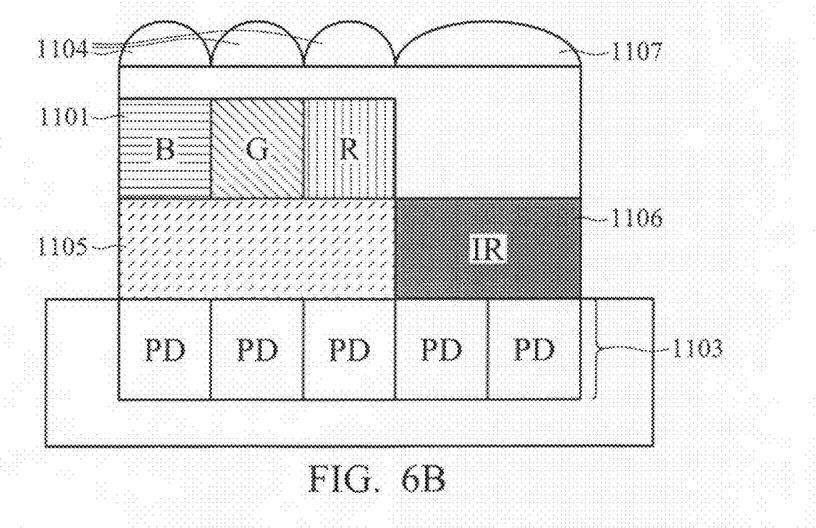
FIG. 6B is a cross-sectional view of the normal pixels and the infrared pixel in accordance with another embodiment of the disclosure.

FIGS. 6A and 6B show the cross-sectional views of the normal pixels and the infrared pixel in accordance with two embodiments of the disclosure. In order to prevent the infrared light beam passing through the dual band pass filter 130 from being detected by the normal pixels. The Notch infrared filter pattern 1105 is applied to the image sensor. In an embodiment shown in FIG. 6A, the Notch infrared filter pattern 1105 is inserted between the micro-lenses 1104 and the color filter units 1101 so as to cover the normal sensor units PD (for detecting red, green, and blue light). In another embodiment shown in FIG. 4B, the Notch infrared filter pattern 1105 is inserted between the color filter units 1101 and the sensor array layer 1103 so as to cover the normal sensor units PD.

The Notch infrared filter pattern 1105 has the same spectral transmittance shown in FIG. 4C. Therefore, the infrared light with the main wavelength $\lambda_1$ will be blocked by the Notch infrared filter pattern 1105 and will not be incident to the normal sensor units PD. This predetermined infrared wavelength $\lambda_1$ is equal to the predetermined infrared wavelength $\lambda_1$ shown in FIG. 2. That is to say, if the main wavelength $\lambda_1$ of the infrared passband of the dual band pass filter 130 is 850 nm, the main wavelength $\lambda_1$ of the infrared light blocked by the Notch infrared filter pattern 1105 will also be 850 nm, and if the main wavelength $\lambda_1$ of the infrared passband of the dual band pass filter 130 is 940 nm, the main wavelength $\lambda_1$ of the infrared light blocked by the Notch infrared filter pattern 1105 will also be 940 nm.

According to the embodiments shown in FIGS. 3B, 4A, 4B, 5B, 6A, and 6B, there are various arrangements for infrared pixels utilized for the PDAF function. Those embodiments merely show some examples. The disclosure is intended to cover various modifications and combinations of those embodiments. All embodiments of a newly designed image sensor are capable of performing the PDAF function in a low-light environment. Furthermore, with some specific configuration, the assistant near-infrared light that passing the dual band filter is not incident to the normal sensor units (for detecting red, green, and blue light), so the normal sensor units can detect the intensity of red, green, and blue light more precisely.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
a sensor array layer comprising a plurality of normal sensor units and a pair of autofocus sensor units;
a plurality of color filter units disposed on the sensor array layer to cover the plurality of normal sensor units;
an IR-pass filter unit disposed on the sensor array layer to cover the pair of autofocus sensor units;
a micro-lens layer comprising a plurality of micro-lenses disposed on the color filter units and the IR-pass filter unit,
wherein one of the pair of autofocus sensor units detects infrared light came from a first side, and the other of the pair of autofocus sensor units detects infrared light came from a second side opposite to the first side to perform a phase detection autofocus function,
wherein the one of the pair of autofocus sensor units is adjacent to the other of the pair of autofocus sensor units, and
wherein the plurality of micro-lenses comprise a plurality of first micro-lenses and a second micro-lens, wherein any of the plurality of first micro-lenses is disposed on one of the plurality of the color filter units to cover one of the plurality of normal sensor units, and the second micro-lens is disposed on the IR-pass filter unit to cover the pair of autofocus sensor units.

2. The image sensor as claimed in claim 1, wherein each of the pair of IR-pass filter units is divided into two halves, wherein one half is filled with an opaque material and the other half is filled with an IR-pass material.

3. The image sensor as claimed in claim 2, wherein in the one of the pair of IR-pass filter units, the opaque material is located at the second side, and the IR-pass material is located at the first side, and
in the other of the pair of IR-pass filter units, the opaque material is located at the first side, and the IR-pass material is located at the second side.

4. The image sensor as claimed in claim 2, wherein the opaque material is metal.

5. The image sensor as claimed in claim 2, wherein the IR-pass material allows light with wavelengths longer than 800 nm or 900 nm to pass through.

6. The image sensor as claimed in claim 1, wherein the two adjacent autofocus sensor units, the IR-pass filter unit, and the second micro-lens compose a first phase detection autofocus set;
the two adjacent autofocus sensor units of the first phase detection autofocus set is arranged along the row direction; and
the image sensor further comprises a second phase detection autofocus set having the same components as the first phase detection autofocus set, but two adjacent autofocus sensor units of the second phase detection autofocus set is arranged along the column direction.

7. The image sensor as claimed in claim 1, wherein the IR-pass filter unit allows light with wavelengths longer than 800 nm or 900 nm to pass through.

8. An imaging device, comprising:
an image sensor, comprising:
a sensor array layer comprising a plurality of normal sensor units and a pair of autofocus sensor units;
a plurality of color filter units disposed on the sensor array layer to cover the plurality of normal sensor units;
a IR-pass filter unit disposed on the sensor array layer to cover the pair of autofocus sensor units;
a micro-lens layer comprising a plurality of micro-lenses disposed on the color filter units and the IR-pass filter unit,
wherein one of the pair of autofocus sensor units detects infrared light came from a first side, and the other of the pair of autofocus sensor units detects infrared light came from a second side opposite to the first side to perform a phase detection autofocus function;
a lens group disposed above the image sensor; and
a dual band pass filter disposed above the lens group or between the lens group and the image sensor,
wherein the dual band pass filter allows visible light and infrared light within a predetermined main wavelength to pass through,
wherein the one of the pair of autofocus sensor units is adjacent to the other of the pair of autofocus sensor units, and
wherein the plurality of micro-lenses comprise a plurality of first micro-lenses and a second micro-lens, wherein any of the plurality of first micro-lenses is disposed on one of the plurality of the color filter units to cover one of the plurality of normal sensor units, and the second micro-lens is disposed on the IR-pass filter unit to cover the pair of autofocus sensor units.

9. The imaging device as claimed in claim 8, wherein each of the pair of IR-pass filter units is divided into two halves, wherein one half is filled with an opaque material and the other half is filled with an IR-pass material.

10. The imaging device as claimed in claim 9, wherein in the one of the pair of IR-pass filter units, the opaque material is located at the second side, and the IR-pass material is located at the first side, and
in the other of the pair of IR-pass filter units, the opaque material is located at the first side, and the IR-pass material is located at the second side.

11. The imaging device as claimed in claim 8, wherein the two adjacent autofocus sensor units, the IR-pass filter unit, and the second micro-lens compose a first phase detection autofocus set;
the two adjacent autofocus sensor units of the first phase detection autofocus set is arranged along the row direction; and
the image sensor further comprises a second phase detection autofocus set having the same components as the first phase detection autofocus set, but two adjacent autofocus sensor units of the second phase detection autofocus set is arranged along the column direction.

12. The imaging device as claimed in claim 8, further comprising:
a Notch infrared filter pattern inserted between the plurality of color filter units and the plurality of micro-lenses or between the plurality of color filter units and the plurality of normal sensor units, wherein the Notch infrared filter pattern blocks the infrared light with the main wavelength from reaching the plurality of normal sensor units.

13. The imaging device as claimed in claim 12, further comprising:
an assistant infrared light source irradiating the infrared light with the main wavelength.

14. The imaging device as claimed in claim 12, wherein the predetermined main wavelength is 850 nm, and the passband of the infrared light is 840~860 nm.

15. The imaging device as claimed in claim 12, wherein the predetermined main wavelength is 940 nm, and the passband of the infrared light is 930~950 nm.

* * * * *